United States Patent [19]

Busacca et al.

[11] 4,247,828

[45] Jan. 27, 1981

[54] RECIPROCATING PISTON TUNING MECHANISM FOR A MICROWAVE OSCILLATOR

[75] Inventors: Guido Busacca; Vincenzo Meli; Arcangelo Passaglia, all of Palermo, Italy

[73] Assignee: Societa Italiana Telecomunicazioni Siemens S.p.A., Milan, Italy

[21] Appl. No.: 53,275

[22] Filed: Jun. 29, 1979

[30] Foreign Application Priority Data

Jul. 3, 1978 [IT] Italy .............................. 25267 A/78

[51] Int. Cl.³ .............................................. H03B 9/10

[52] U.S. Cl. .................................. 331/90; 315/39.61; 331/178; 333/226

[58] Field of Search ........................ 331/86, 90, 96–98, 331/178; 315/39.55, 39.61; 333/226, 233

[56] References Cited

U.S. PATENT DOCUMENTS

| | | | |
|---|---|---|---|
| 3,414,761 | 12/1968 | Glenfield | 331/90 X |
| 3,441,794 | 4/1969 | Chun | 331/90 X |
| 3,441,795 | 4/1969 | Hynes et al. | 331/90 X |
| 3,590,313 | 6/1971 | Stoke | 315/39.61 |
| 3,852,638 | 12/1974 | Stoke | 315/39.61 |

*Primary Examiner*—Siegfried H. Grimm
*Attorney, Agent, or Firm*—Karl F. Ross

[57] ABSTRACT

A resonant cavity of a microwave generator, such as a magnetron oscillator, is provided with a tuning piston which is displaceable between two terminal positions, corresponding to respective limiting frequencies, by means of a rotating crank-shaft whose eccentric portion is hugged by a nonrotatable follower ring suspended between two flexible wires or blades extending generally radially outward from diametrically opposite points of the ring. A yoke spacedly surrounding the ring is provided with two oppositely extending tubular arms in which the wires or blades are received with clearance while being fastened to the ends of these arms remote from the yoke; the tuning piston is rigidly connected with one of the two arms.

6 Claims, 2 Drawing Figures

RECIPROCATING PISTON TUNING MECHANISM FOR A MICROWAVE OSCILLATOR

FIELD OF THE INVENTION

Our present invention relates to a tuning mechanism for a microwave oscillator, such as a magnetron, having a resonant cavity in which a tuning element such as a piston is linearly displaceable between two terminal positions corresponding to respective limiting frequencies.

BACKGROUND OF THE INVENTION

In commonly owned copending U.S. application Ser. No. 8,091, filed Jan. 31, 1979 by one of us, Guido Busacca, jointly with three others, there has been described a mechanism for the purpose set forth in which an annular tuning piston axially displaceable in the cylindrical cavity of a magnetron of the coaxial type is coupled with an eccentric portion of a rotating crankshaft via a pitman whose length is related in a predetermined manner to the eccentricity of the crankshaft in order to linearize the relationship between the operating frequency of the oscillator and the displacement of the crankshaft drive as determined by a position sensor. The extremity of the pitman remote from the crankshaft axis is articulated to a linearly guided yoke rigid with the tuning piston.

Whereas the operation of this earlier tuning mechanism is generally satisfactory, friction inevitably occurs at the articulated joint between the yoke and the pitman as the latter executes a motion with a transverse component. This friction is a cause of wear at the joint itself as well as along the guide surfaces of the piston rod subjected to lateral stresses by that transverse component of motion.

OBJECTS OF THE INVENTION

An important object of our present invention, therefore, is to provide an improved tuning mechanism of the general type described in the above-identified copending application, enabling the operating frequency of a microwave oscillator to be varied at a high rate (e.g. of several tens of thousands of cycles per minute corresponding to as many crankshaft RPM) by substantially eliminating the above-described source of friction.

Another object is to provide a mechanism of this character establishing a linear relationship between the stroke of a tuning piston and the angle of rotation of an associated crankshaft.

SUMMARY OF THE INVENTION

We realize these objects, in accordance with the instant invention, by replacing the pitman in the system of application Ser. No. 8,901 (whose disclosure is hereby incorporated by reference in the present application) with a follower ring surrounding the eccentric crankshaft portion, offset by a distance e from the axis of rotation, in operative engagement therewith, for radial displacement thereby with a stroke 2e in the direction of motion of the controlled tuning element and with lateral excursions of the same magnitude ($\pm$e) in a direction transverse thereto, corresponding to those of the pitman head in the earlier application. The follower ring, which may be coupled with the crankshaft—just like that pitman head—by way of a roller bearing or equivalent antifriction means, is spacedly surrounded by a yoke having two arms extending generally in the aforesaid direction of motion on opposite sides of the axis of rotation; one of these arms is rigid with the linearly guided tuning element. The connection between that element and the ring hugging the crankshaft comprises a pair of tensioned flexible members, such as wires or blades, having first ends anchored to the ring at diametrically opposite points and having second ends anchored to respective extremities of the arms remote from the axis of rotation of the crankshaft.

The arms rigid with the yoke are preferably designed as a pair of coaxial tubes traversed with clearance by the flexible members respectively anchored thereto. The linear guidance for the tuning element can then be provided by linear ball bearings engaging these arms.

BRIEF DESCRIPTION OF THE DRAWING

The above and other features of our invention will now be described in detail with reference to the accompanying drawing in which.

SPECIFIC DESCRIPTION

Figure 1:
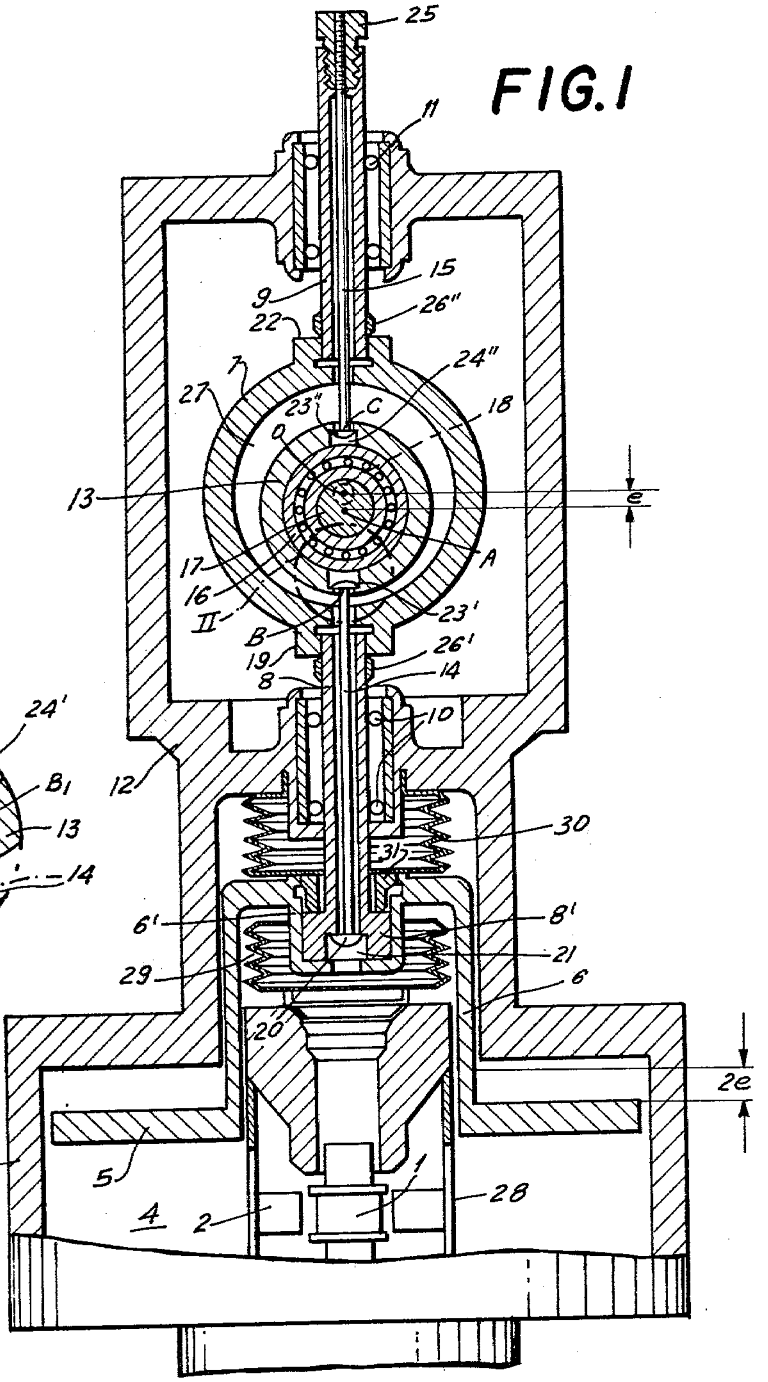
FIG. 1 is an axial sectional view of a magnetron oscillator embodying the present invention.
Figure 2:
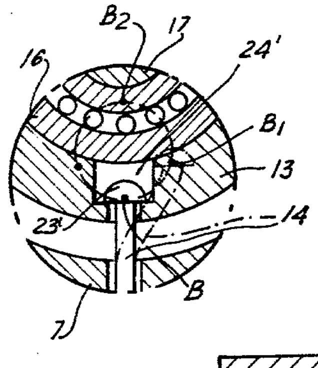
FIG. 2 is an enlarged detail view of the area encompassed by a circle II in FIG. 1.

In FIG. 1 we have shown a coaxial magnetron comprising a cathode 1 at the center of an anode block 2 illustrated in greater detail in the copending application identified above. This electrode structure is concentrically surrounded by an annular cylinder 3 defining therewith an annular resonant cavity 4 which communicates with the interior of the structure by way of slots 28 in the anode wall. The effective volume of resonant cavity 4 can be varied with the aid of an annular piston 5 of conductive material, spaced from the conductive cavity walls, which is provided with a boss 6 of inverted-cup shape encompassing part of the electrode structure. Bellows 29 and 30 keep the evacuated cavity 4 sealed against the atmosphere.

Cylinder 3 is integral with a housing 12 in which two tubular arms 8 and 9 centered on the cavity axis are guided by linear ball bearings schematically indicated at 10 and 11. Arm 8 terminates in an enlarged lower extremity 8' lodged in a socket 6' of boss 6 to which it is secured by a nut 31; the opposite end of this arm is screwed into an internally threaded nipple 19 of a cylindrical yoke 7 whose horizontal axis 0 intersects the vertical axis of electrode structure 1, 2 and cylinder 3. Another internally threaded nipple 22 is integral with yoke 7 at a location diametrically opposite nipple 19 and receives the lower end of arm 9.

A crankshaft 18, rotating about axis 0, has an offset portion 17 of eccentricity e surrounded by a follower ring 13 with interposition of a ball bearing 16. A tensioned wire 14 has a lower head 20 received in a recess 21 of extremity 8' of arm 8 and passes with all-around clearance through the bore of this arm into engagement with ring 13 which has an inner recess 24' accommodating another head 23' of the wire. In a similar manner, a head 23" of another wire 15 is received in an inner recess 24" of ring 13 diametrically opposite recess 24', wire 15 passing with clearance and under tension through the bore arm 9 and having its upper end threadedly engaged by a nut 25 screwed into the upper end of this latter arm. The tension of wires 14 and 15 can be adjusted by varying the extent to which the threaded ends of the respective arms 8 and 9 are screwed into the corresponding nipples 19 and 22, the arms being then locked in position with the aid of respective counternuts 26' and 26".

Follower ring 13 and yoke 7 are separated by an annular clearance 27 which, of course, must be wide enough to allow for the necessary horizontal and vertical excursions of the ring when the crankshaft 18 is rotated by a nonillustrated drive motor coupled therewith. In the position illustrated in the drawing, the assembly 13, 16, 17 is at its lower dead center with its axis A lying below the axis of rotation 0 by the distance e; piston 5 is then at its lowest point corresponding to the minimum volume of cavity 4 and thus to the maximum operating frequency. The junctions B and C of wires 14 and 15 with ring 13 are vertically equispaced from this axis A and move codirectionally therewith; the orbit of point B, paralleling those of point C and axis A, has been illustrated in FIG. 1. After a quarter of a cycle (assuming counter-clockwise rotation) the junction point of wire 14 lies at a location $B_1$, laterally offset from point B by the eccentricity e which represents the radius of that orbit; wire 14, accordingly, flexes to the right. After another quarter turn of the crankshaft 18, that junction point lies at $B_2$ along the housing axis, having risen by 2e from its original position. Point $B_3$, reached after a further 90° rotation, is symmetrical to point $B_1$ with wire 14 flexing to the left.

The other wire 15, evidently, undergoes a similar bilateral bending motion in the course of a cycle. The simultaneous flexing of both wires increases their tension to an extend depending on the ratio of eccentricity e to the length of these wires; that ratio, therefore, should be as small as possible and substantially identical for the two wires.

In contradistinction to the arrangement described in application Ser. No. 8,091, in which the piston stroke is a nonlinear function of the pitman length, our present invention establishes a simple harmonic motion for the tuning piston with a stroke proportional to the cosine of the angle of crankshaft rotation which can be determined by a conventional position sensor. The two wires 14, 15 alternately pull the piston in opposite directions and are not required to transmit any thrust. These wires could also be replaced by other flexible tension members, such as blades of generally rectangular cross-section with minor sides paralleling the plane of rotation.

We claim:

1. In a generator of microwaves of variable frequency provided with a resonant cavity and a tuning element in said cavity, said tuning element being linearly displaceable between two terminal positions corresponding to respective limiting frequencies, the combination therewith of:

a rotatable crankshaft provided with an eccentric portion offset by a distance e from its axis of rotation;

a follower ring surrounding said eccentric portion in operative engagement therewith for radial displacement thereby with a stroke 2e in the direction of motion of said tuning element and with lateral excursions of like magnitude in a direction transverse thereto;

a yoke spacedly surrounding said ring, said yoke being provided with two arms extending generally in said direction of motion on opposite sides of said axis of rotation, one of said arms being rigid with said tuning element; and a pair of tensioned flexible members having first ends anchored to said ring at diametrically opposite points and having second ends anchored to respective extremities of said arms remote from said axis of rotation for translating the displacement of said ring by said crankshaft into a reciprocation of said tuning element.

2. The combination defined in claim 1 wherein said arms are coaxial tubes traversed with clearance by said flexible members.

3. The combination defined in claim 2, further comprising a housing rigid with said resonant cavity and guide means in said housing slidably engaging said arms.

4. The combination defined in claim 2 or 3 wherein said yoke is provided with internally threaded nipples, said arms having threaded ends screwed into said nipples.

5. The combination defined in claim 4 wherein said threaded ends are provided with locking nuts enabling a variation in the tension of said flexible members.

6. The combination defined in claim 1, 2 or 3 wherein said yoke is annular and centered on said axis of rotation.

* * * * *